United States Patent [19]

Lawrence

[11] Patent Number: 4,561,541
[45] Date of Patent: Dec. 31, 1985

[54] CARRIER SYSTEM FOR PHOTOVOLTAIC CELLS

[75] Inventor: Ivan R. Lawrence, Simi Valley, Calif.
[73] Assignee: Spectrolab, Incorporated, Sylmar, Calif.
[21] Appl. No.: 536,057
[22] Filed: Sep. 26, 1983
[51] Int. Cl.[4] .................. B65D 21/02; B65D 85/30; B65D 73/02
[52] U.S. Cl. .................. 206/332; 136/290; 206/509; 206/558; 217/26; 217/26.5
[58] Field of Search ............ 206/328, 329, 332, 333, 206/334, 557, 558, 562, 564, 509; 136/290; 217/26, 26.5

[56] References Cited

U.S. PATENT DOCUMENTS

| | | | |
|---|---|---|---|
| 3,191,791 | 6/1965 | Jackson | 206/332 |
| 3,469,686 | 9/1969 | Gutsche | 206/332 |
| 3,667,647 | 6/1972 | Van Daalen | 217/26 |
| 3,712,695 | 1/1973 | Kaye | 206/558 |
| 3,904,103 | 9/1975 | Chadbourne | 217/26.5 |
| 3,946,864 | 3/1976 | Hutson | 206/332 |

FOREIGN PATENT DOCUMENTS

| | | | |
|---|---|---|---|
| 1178157 | 1/1970 | United Kingdom | 206/509 |
| 504690 | 4/1976 | U.S.S.R. | 206/503 |

*Primary Examiner*—George E. Lowrance
*Attorney, Agent, or Firm*—J. Holtrichter, Jr.; W. J. Bethurum

[57] ABSTRACT

A tray for testing and storage of photovoltaic e.g. solar cells, is described, enabling processing or testing of such cells to be conducted while supported on the tray. The tray comprises a base having a peripheral rim extending upwardly around the upper surface of the base, and serving to at least partially retain one or more of the cells within a pre-defined position on the upper surface. One or more indexing elements are provided on the upper surface of the tray to co-operate with the peripheral rim to define a number of pre-defined cell positions on the upper surface of the tray, for selectively retaining any of a plurality of different sized cells. A vacuum chamber is provided to retain the solar cell in its pre-defined position on the tray. Apertures are provided in the base of the tray and extend to the pre-defined cell positions to permit probes to extend therethrough and into contact with the solar cell. A mold used in producing the tray is provided with holes at predetermined locations, and by employing removable plugs of predetermined shape for the holes, a mold is obtained having a required configuration to produce a tray having indexing elements at preselected positions dependent upon the presence or absence of plugs in the holes of the mold. A method for making a tray according to the invention is also described.

20 Claims, 14 Drawing Figures

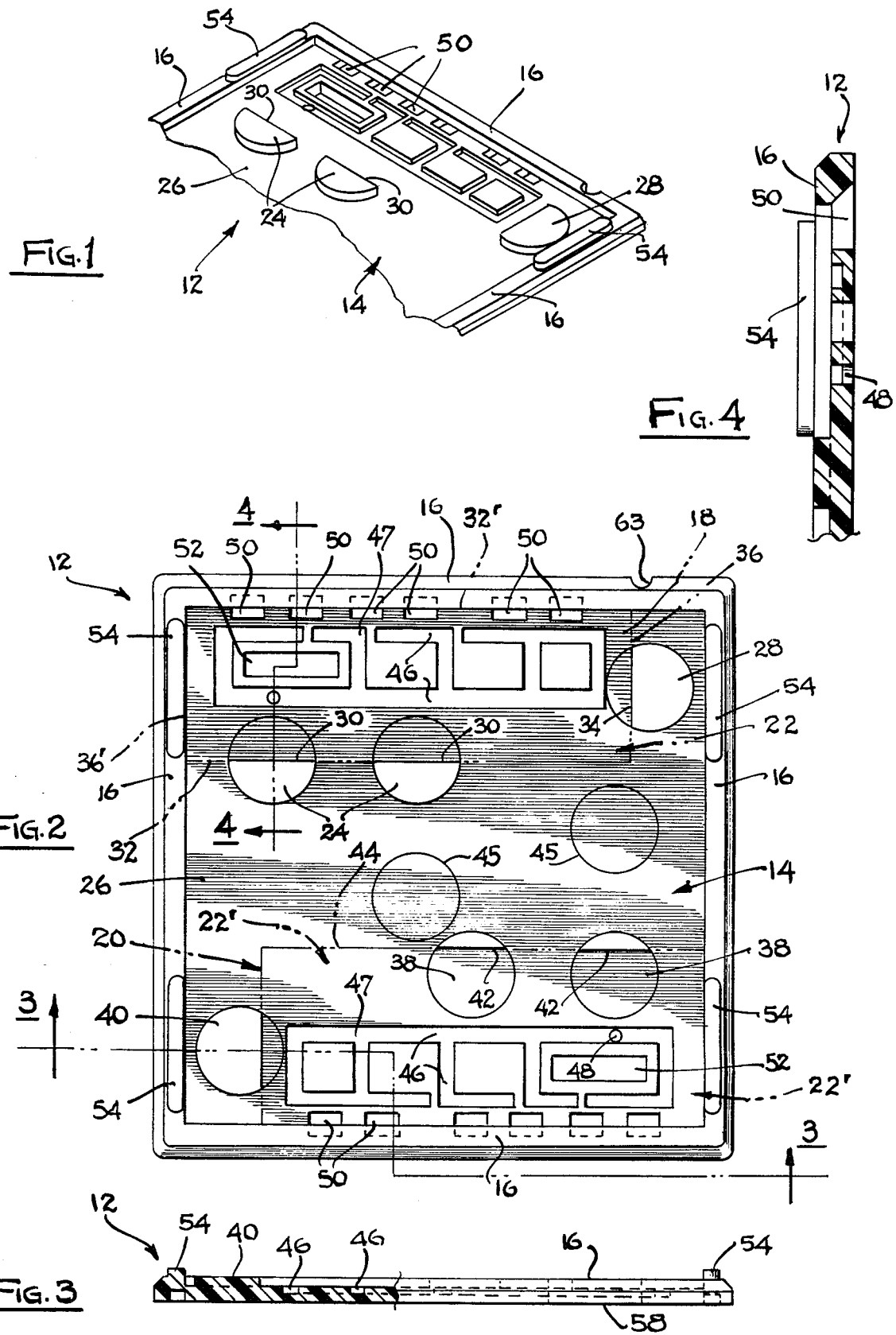

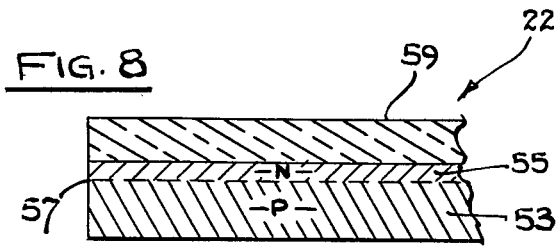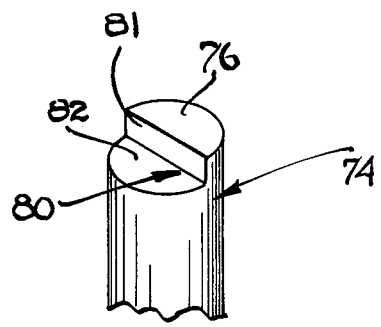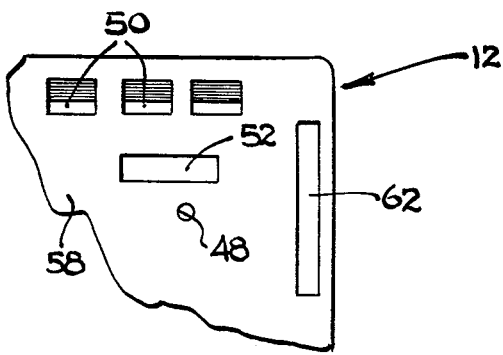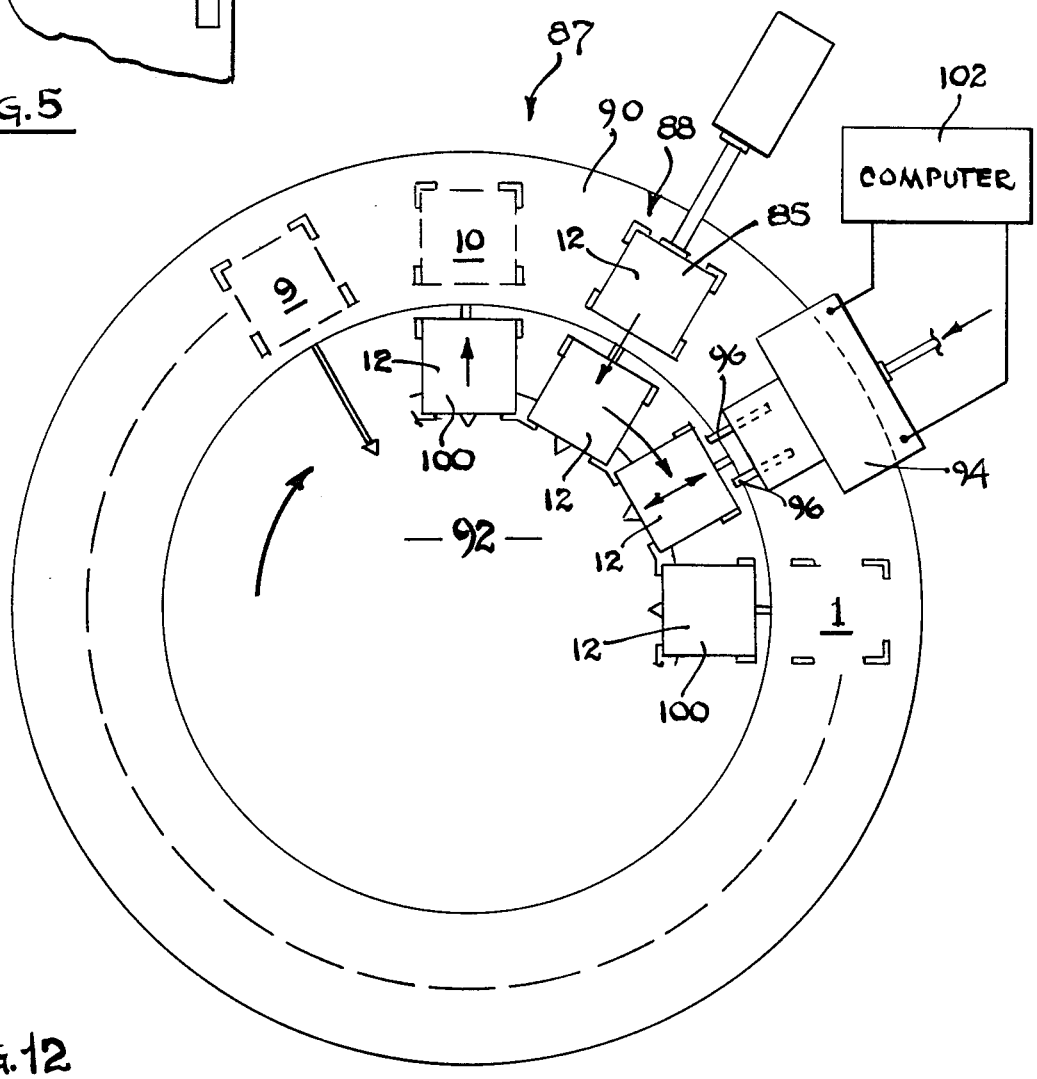

CARRIER SYSTEM FOR PHOTOVOLTAIC CELLS

TECHNICAL FIELD

This invention relates to the processing and testing of photovoltaic cells, and is particularly concerned with the provision of a carrier system, particularly in the form of a tray for transport and storage of such cells and which enables processing or testing to be conducted on said cell while in said carrier or tray.

BACKGROUND OF THE INVENTION

1. Field of the Invention

This invention provides a novel tray for support, transport and storage of photovoltaic cells, such as solar cells, which permits processing and testing of such cells, and including a novel mold for producing such tray, the method of making the tray, and means facilitating stacking the trays containing solar cells for storage or further processing.

2. Brief Description of the Prior Art

Solar cells are very thin and fragile, and may be of the order of 8 mils thick and in many cases may be as small as 1 to 2 mils thick. Consequently, in the usual practice, there is a great amount of breakage during processing and testing of such cells. This results in a high waste cost, and substantially increases the final cost of the solar cells.

Solar cells which are used in outer space must be relatively thin for both performance and reduced weight. Even terestrial cells must be made of a thinner construction in order to become economically feasible in many applications. Futher, Gallium Arsenide and similar III-V materials are replacing silicon as the active cell material and in many cases are more fragile than silicon.

Present practice for testing solar cells is to place an inividual cell on a copper block in a test area, such copper block typically containing one set of leads on the underside of the block which is automatically attached to one side of the cell. Therafter, leads are placed on the cell which is located on the copper block. The cell must be manually placed on and removed from the block and placed in a retainer or box containing solar cells having the same electrical characteristics. This handling of the solar cells results in a substantial amount of damage and breakage of the solar cells. This is a very labor intensive procedure which not only is inefficient, but requires a substantial amount of time for the operator to accurately position the solar cell on the copper block for proper testing. It is of critical importance in the solar cell testing operation to accurately position the cell on the block in order to obtain an accurate test reading. Further, only one solar cell can be processed on the block at any one time.

Further, the excessive amount of handling of the solar cells when employing the copper block not only results in substantial breakage, but such handling, in addition, often results in contamination and destruction of the cell, since once contaminated it is virtually useless. To avoid such contamination, the operator must use special handling gloves in many of the testing operations.

Accordingly, a primary goal of much research effort has been to reduce substantially the amount of manual involvement in the processing and testing of photovoltaic or solar cells. This is necessary in order to reduce the amount of breakage and the cost involved in such processing and testing. The main difficulty in this area is due to the low weight and thin characteristics of solar cells, which therefore renders them very fragile. Another goal has been to reduce the amount of contamination of the solar cells and to reduce the need of cumbersome gloves used by operators during testing and processing. A particular need has been the ability to test and process different sized solar cells simultaneously and to store and package such different sized solar cells. This permits satisfying those users and customers who desire one size of solar cell for a specific purpose while others want a different size solar cell. Thus, while there are not standard sizes of solar cells, it is desirable to handle all known incrementally different sizes of solar cells.

SUMMARY OF THE INVENTION

According to the present invention, there is provided a tray for transport, testing and storage of photovoltaic or solar cells which enables processing or testing to be conducted on the cell while supported in the tray. The tray comprises a base having a peripheral edge or rim extending upwardly from the upper surface of the base, and at least partially retaining one or more of the cells within a defined position on the upper surface, and often referred to as a "pre-defined" cell position on that upper surface. Indexing means are provided on the upper surface of the tray to engage peripheral portions of the cell and which function in conjunction with the peripheral edges on the tray to retain a solar cell within a pre-defined position on the tray.

A predetermined number of possible indexing positions for a plurality of solar cells is provided on the tray upper surface, for selectively retaining any of a plurality of different sized photovoltaic or solar cells, with different combinations of the indexing positions defining different pre-defined cell positions. The cell positions or so-called "pre-defined" positions for the solar cells on the tray are created by combinations of upstanding indexing elements capable of being integrally formed in the base upper surface of the tray at the indexing positions. The indexing elements cooperate with the upstanding peripheral edges on the tray to provide the pre-defined cell positions for a selected size and shaped solar cell.

As used herein, the term "indexing position" will represent that position on the base of the tray in which an indexing pin (e.g. an indexing element) can be integrally formed, whether or not such element is present. The term "indexing element" is that upstanding pin or other element located at an indexing position which is adapted to physically engage an edge of a solar cell positioned on the tray. The predefined cell position is that selected area on the tray which is defined by one or more of the indexing elements and typically the rim of the tray in combination.

Means are provided to form a chamber beneath at least a portion of a solar cell retained in the pre-defined cell position on the tray. Port means communicate with such chamber to permit creation of a vacuum within the chamber, thereby retaining the solar cell in its defined position on the tray. Aperture means are provided in the base of the tray which extend through the upper surface of the tray in the pre-defined cell positions for retaining the solar cells, to permit probes to extend through the aperture means and into contact with the solar cell.

Another feature of the invention is the provision of a novel mold which is used for producing the tray. The mold is provided with holes at predetermined locations, and by employing removal plugs for said holes, and plugs of predetermined shape, a mold is obtained having the required configuration to produce a tray from a castable plastic. This molded tray will be of a desired tray size, and have indexing elements provided in predefined positions in accordance with the presence or absence of plugs or in accordance with the size of plugs in the holes of the mold, to provide the pre-defined cell positions for retaining the desired size of solar cells therein.

In making a tray having a plurality of pre-defined cell positions for storage and transport of photovoltaic or solar cells, employing a mold as described above, plugs are inserted into one or more of the holes in the mold at each location where no indexing element is to be formed, so that the outer surface of each of the plugs is substantially coplanar with the mold major surface. Where it is desired to provide an indexing element on the tray thus molded, a portion of the plugs for one or more of the holes in the mold is removed. In this way the mold will have a hole or hole portion in order to form an indexing element on the tray at such locations. The plugs can be formed of different shapes to provide indexing elements of different shapes on the tray. Thus, a section of the outer portion of a plug can be removed to form a notch in such outer portion, resulting in the formation of an indexing element on the tray when moldded, having the shape of such notch, as described hereinafter. A moldable plastic material is introduced with respect to the mold and a second co-operating mold surface to form a tray with the holes in the mold integrally forming upstanding indexing elements on the tray to define the predefined cell positions for receiving selected sized and shaped solar cells.

The mold arrangement employed uses a plug in each location of a hole in the mold, with portions of the plugs removed, e.g. plugs of reduced size to form an indexing element, as aforesaid. This is desirable since the plug can extend from one side of the mold to the other in order to facilitate removal of the plugs. However, it is also possible to use a mold arrangement where the holes in the mold do not extend from one side of the mold to the other. In this latter arrangement it is possible to employ no plugs in the holes where an upstanding indexing element is to be formed on the tray. Inserts (not shown) could be introduced into each hole where no plug is to be provided so as to insure that the overall height of the indexing element, thus formed, is approximately the same as the rim of the tray.

In operations for processing and testing solar cells, the cells are placed in the plastic carrier or tray by a loading mechanism and are then brought to the test area by automated or manual handlers. The test probes which can be electrical and thermal, contact the solar cell on the top and bottom surfaces. The bottom contact is through the apertures in the tray. A vacuum probe or connection contacts the vacuum chamber formed in the tray, and which vacuum is maintained throughout the chamber by vacuum channels molded into the tray. The vacuum probe is actuated prior to the contact of the test probes with the cell, and functions to retain the solar cells in place during testing. In one specific embodiment of the tray according to the invention, the arrangement of indexing elements provides for two different predefined cell positions to retain two different cell sizes in the same tray. The electrical probes connected to the solar cell determine the electrical characteristics of each of the solar cells.

According to another feature of the invention, the trays which may contain the solar cells in the pre-defined cell positions on the trays, can be disposed in a stacked arrangement for testing or storage of the solar cells. For this purpose, the upper peripheral rim of the trays can be provided with upstanding shoulders or tabs, which are arranged to mate with corresponding grooves or notches in the bottom surface of another tray. This arrangement of grooves and tabs constitutes a registering means, and a plurality of spaced apart tabs and grooves can be provided along the peripheral rim of the respective trays so that the trays can be stacked with respective solar cells positioned in alignment on the respective trays.

For automatically testing a plurality of solar cells, the solar cells can be positioned on a plurality of stacked trays, and means can be provided for automatically discharging one of the trays, testing the solar cells on such tray, and automatically discharging the tray into one of a plurality of storage compartments corresponding to the electrical characteristics or other characteristics of the solar cells on such tray.

The tray produced according to the invention is highly effective in that it accurately positions the solar cell so that each cell is accurately positioned for the ultimate testing operation. Thus, the tray not only functions to transport a solar cell, but also enables an accurate and relatively rapid and efficient positioning of a solar cell in a testing mechanism and in addition, it permits testing of the cell while in the tray. In this way, the solar cell never has to leave the tray. Further, the glass support usually placed on the top of the solar cell, can be placed on the solar cell in the tray and retained thereon Thus, a unique advantage of the invention is that once the solar cell is placed in the tray, all testing can be done without the glass on the cell and with the glass on the cell. It can then be stored and transported in the same condition.

Thus, the solar cells are tested in place using a carrier or tray according to the invention that is not thermally or electrically conductive. This results in substantially less handling and consequent damage to solar cells, and also reduces the complexity and cost of the processing equipment while increasing throughput. Accurate positioning of the solar cells on the tray facilitates use of automated testing and handling equipment. In addition, the use of the tray enables automated processing and at very least makes manual processing more efficient. The tray of the invention substantially reduces labor costs for cell testing and processing and provides the consumer with the option of obtaining solar cells of different sizes. Another advantage of the tray is that it can be readily cleaned and is reusable.

The tray of the invention can be readily produced from a mold employing removable pins or plugs to permit obtaining a mold of the required configuration to produce a desired tray size with the indexing means positioned on the tray in the desired locations.

This invention possesses many other advantages and has other purposes which may be made more clearly apparent from a consideration of the forms in which it may be embodied. These forms are shown in the drawings forming and accompanying part of the present specification. They will now be described in detail for the purposes of illustrating the general principles of the invention, but it is to be understood that such detailed descriptions are not to be taken in a limiting sense.

BRIEF DESCRIPTION OF THE DRAWINGS

Figure 2A:
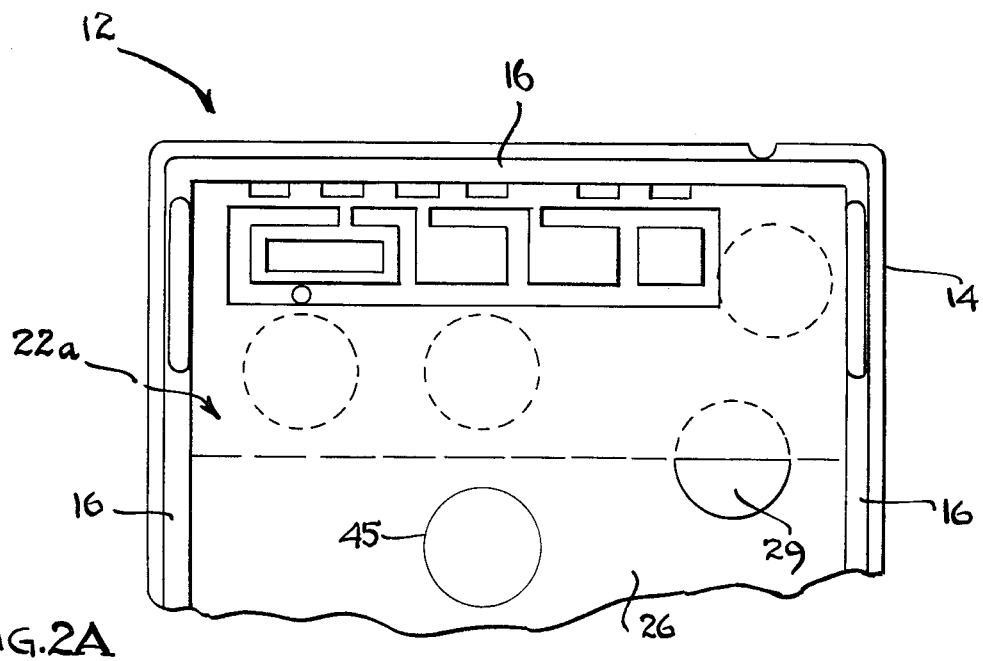
Figure 2B:
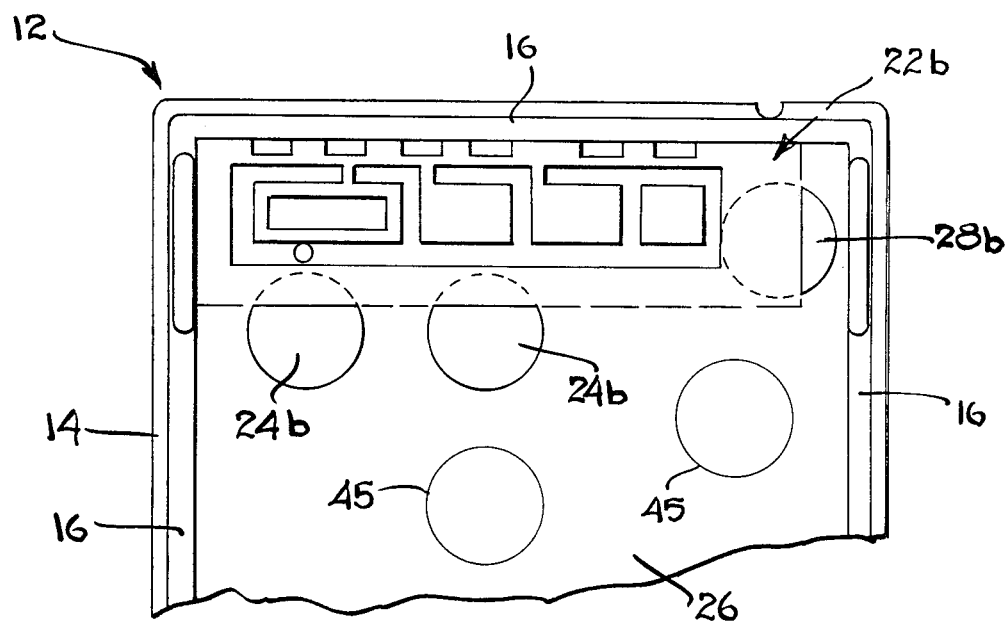
Figure 6:
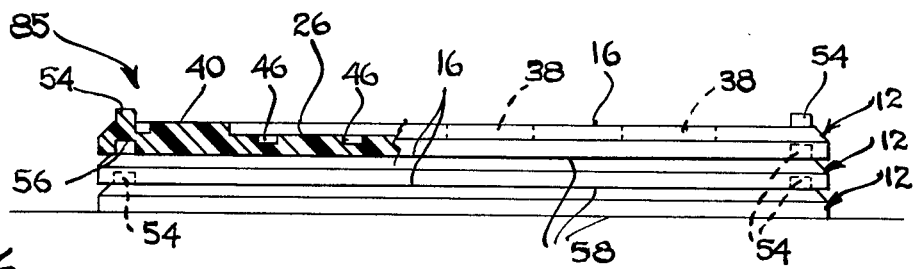
Figure 7:
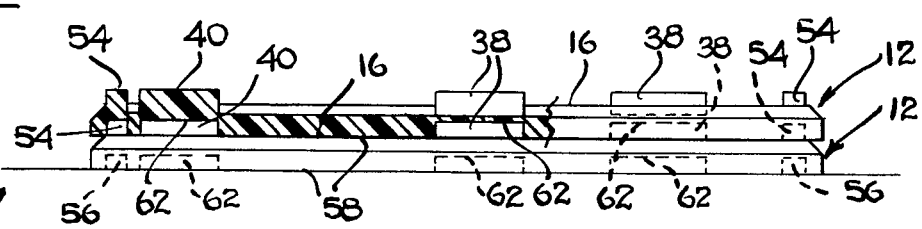
Figure 9:
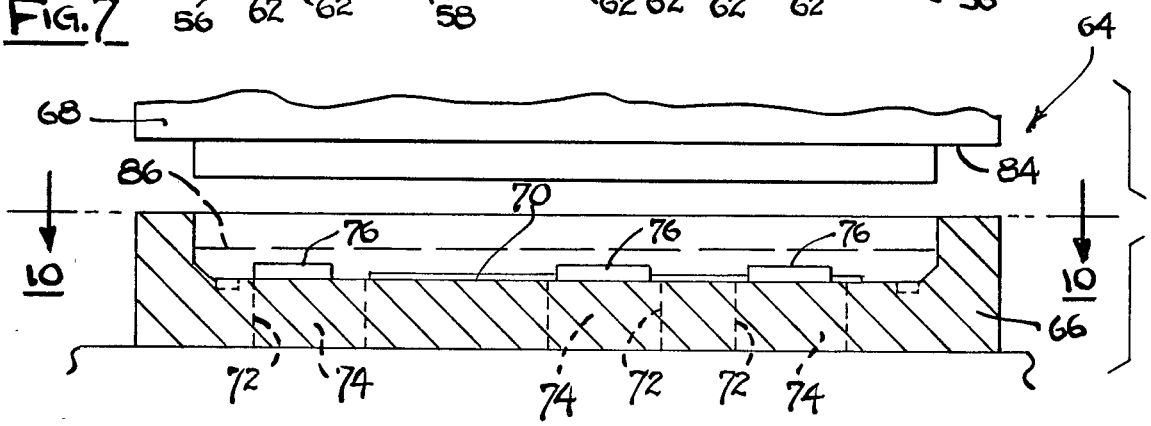
Figure 10:
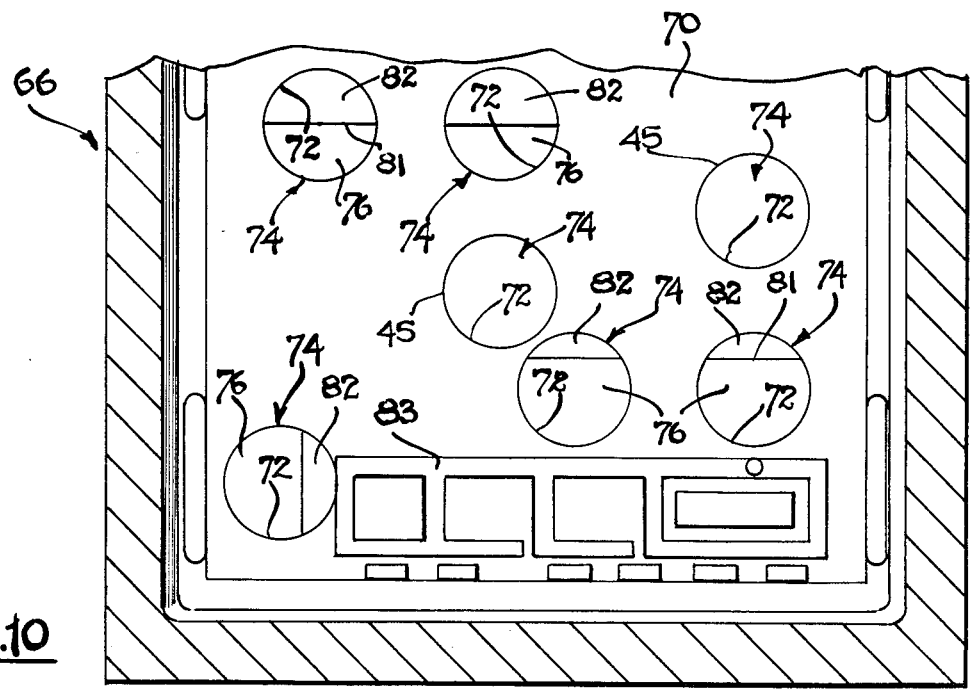

Having thus described the invention in general terms, reference will now be made to the description below of certain preferred embodiments of the invention taken in conjunction with the accompanying drawings wherein:

FIG. 1 is a partial perspective view of a tray employed for transporting, storing and testing solar cells according to the invention;

FIG. 2 is a top plan view of the tray of FIG. 1, showing a a pair of solar cells in positions therein in phantom lines;

FIG. 2A is a top plan view, similar to FIG. 2, but showing a solar cell of a different size in a different pre-selected cell position;

FIG. 2B is a top plan view, similar to FIGS. 2 and 2A, and showing a solar cell of still another size in still another preselected cell position;

FIG. 3 is a partial side elevational view and partial sectional view taken along line 3—3 of FIG. 2;

FIG. 4 is a vertical sectional view taken along line 4—4 of FIG. 2;

FIG. 5 is a fragmentary bottom plan view of a portion of the tray showing probe apertures therein;

FIG. 6 is a side elevational view, partially broken away and in section, of a plurality of trays of the type of FIGS. 1 to 5, in stacked relation;

FIG. 7 is a side elevational view, partially broken away and in section, showing another embodiment of a pair of stacked trays;

FIG. 8 is a cross-section of one type of a photovoltaic cell or solar cell which can be positioned in the tray of the invention;

FIG. 9 is a vertical sectional view showing the mold for producing a tray according to the invention;

FIG. 10 is a fragmentary horizontal sectional view taken along line 10—10 of FIG. 9;

FIG. 11 is a perspective view of one form of mold plug which can be employed in the tray mold of FIGS. 9 and 10; and FIG. 12 is a schematic plan view which illustrates a device for automatically testing a plurality of solar cells each positioned on a plurality of stacked trays, including means for selectively discharging each tray and the solar cells thereon for testing, and for placing the respective trays and solar cells thereon following testing in predetermined storage compartments corresponding to the characteristics of the respective solar cells.

DETAILED DESCRIPTION OF PREFEFFED EMBODIMENTS OF THE INVENTION

Referring to FIGS. 1 to 3 of the drawings, numeral 12 illustrates a carrier or tray for transporting, testing and storing photovoltaic cells, particularly solar cells, according to the invention. The tray 12, as illustrated, is essentially square in shape and is preferably formed of a plastic material, although other materials can be employed. Preferably the materials should not be thermally or electrically conductive, although in some cases thermally conductive materials such as beryllium oxide can be employed. The tray 12 has a base 14 and an upstanding peripheral edge or rim 16 extending around the base. As will be seen hereinafter, the peripheral rim 16 functions to at least partially retain the solar cells within a pre-defined cell position on the upper surface of the base 14.

The tray 12, as shown, has two pre-defined cell positions 18 and 20 illustrated and which are adjacent opposite sides of the tray, each being adapted for retaining a solar cell, indicated by phantom lines 22 and 22', respectively. The solar cells 22 and 22' are generally of rectangular shape, the predefined cell positions 18 and 20 being designed to accommodate solar cells of different sizes, the width of the solar cell 22' being somewhat greater than the width of the solar cell 22.

The pre-defined cell position 18 on one side of the tray 12 is partially defined by portions of the peripheral rim 16, and also by a pair of laterally aligned indexing elements 24 on the upper surface 26 of the tray base 14, and an individual upstanding indexing element 28 to one side of elements 24 and positioned closely adjacent to the peripheral rim 16. The indexing elements 24 and 28 are in the form of semi-circular bosses integrally molded into the tray base 14. The straight edges 30 of bosses 24 are in lateral alignment to define stops or abutments for one longitudinal edge 32 of the solar cell 22, and the straight edge 34 of the indexing element 28 forming a stop or abutment for one of the transverse edges 36 of the solar cell 22.

It will thus be seen that the solar cell 22 is retained and held in the cell position 18 by the indexing elements 24 and 28 and by the peripheral edge 16 of the tray, which form stops for the opposite longitudinal and transverse edges 32' and 36' of the solar cell 22.

The pre-defined cell position 20 for the solar cell 22' located adjacent the opposite sides of peripheral rim 16 from cell position 18, has indexing means for the solar cell similar to the pre-defined cell position 18. These include upstanding integral indexing elements or bosses 38 in lateral alignment and upstanding integral indexing element 40, on the upper surface 26 of the base 14 to one side of elements 38. The only difference in the indexing elements 38 in the pre-defined cell position 20, as compared to the indexing elements 24 in the pre-defined cell position 18, is that the indexing elements 38, while initially defined by circular indexing positions, have a greater amount of material removed, as hereinafter described. Thus, the indexing elements 38 are in the form of arcuate bosses having a straight edge 42 which forms the stop for one of the longitudinal edges 44 of the solar cell 22'. In other words, the indexing elements 38, which are located at indexing positions of the same diametral size as the indexing elements 24, have a small peripheral dimension including a smaller alignment edge, e.g. the edge 42 and hence pre-defined cell position 20 accommodates a solar cell 22' of greater width than the solar cell 22.

The tray of the present invention is fabricated in such manner that a plurality of possible index element positions are provided. In the embodiment as illustrated in FIG. 2, for example, at least eight possible indexing positions are shown when the upstanding indexing elements are pin-like and circular in cross-section. Mold parting lines 45 illustrate two additional potential indexing positions where indexing elements are not provided, but could be formed when desired. In the event that it was desired to form a pre-defined cell position extending from the lower portion of the rim in FIG. 2 to one of the indexing positions 45, an indexing element would be formed at either of those positions.

If a solar cell were to be defined by at least the lower edge of the rim in FIG. 2 and an indexing element at either of the indexing positions 45, then the indexing element 38 would not be formed, but the indexing positions at which the elements 38 are positioned might be shown by mold-parting lines on the upper surface 26.

Further, in accordance with the present invention, the various indexing elements can be provided with the proper diametral size, that is, to present a flat face, spaced from a peripheral edge of the tray to accommodate a pre-selected size of solar cell. Thus, when the upstanding indexing elements or pins are circular in cross-section, the annular surface or margin serves as the limit or abutment edge to engage an edge of a solar cell and define an edge of a pre-defined cell position. In order to increase the possible number of pre-defined cell positions, portions of the upstanding indexing pins are effectively removed to provide vertical flat faces, as for example, with the indexing pins or elements 24, 28 and 38 and 40. These vertical flat faces thereby serve as the limit or abutment surfaces to engage an edge of a solar cell and define an edge or boundary of a pre-defined cell position. In this way, a large number of potential solar cell sizes can be accommodated on the tray of the invention.

FIG. 2A shows a different pre-defined cell position 18 which is formed by the inner surface of the rim 16 and a portion of an indexing element 29. In this case the indexing elements 24 and 28 are not employed. FIG. 2B shows still a different pre-defined cell position 18b which is formed by two wall portions of the rim 16 and by three indexing elements 24b and 28b. However, in this case the indexing elements 24b and 28b while similar to the indexing elements 24 and 28 use different proportions of these elements to generate a different pre-defined cell size.

Formed in the upper surface 26 of the tray base 14 with each of the indexing elements is a series of channels 46 forming a chamber 47 beneath a portion of each of the solar cells 22 and 22', when such cells are positioned on the tray base 14 at the respective indexing positions 18 and 20. A separate port 48 is provided in the base 14 of the tray to communicate with each of the chambers 47, to permit a vacuum to be created within the chambers 47 to retain the respective solar cells 22 and 22' in their respective indexing positions.

Inasmuch as any pre-defined cell position will always utilize the inner surfaces of the rim 16, a solar cell positioned in the tray will always extend to either the upper or the lower edge of the rim as shown in FIG. 2. In this way, a portion of any solar cell disposed in any pre-defined cell position will always be located over the vacuum chamber 47.

At each of the indexing positions 18 and 20, and disposed closely adjacent to the peripheral edges of the rim 16 on opposite sides of the tray base 26, are a plurality of probe holes 50 through which electrical probes can be passed through the bottom of the tray so as to contact the bottom of the solar cells during electrical testing of the cells. The probe holes are each formed with a tapered wall section, as shown in FIG. 4, to facilitate introduction of the probes. An additional rectangular hole 52 is provided in the tray base 14 at each of the indexing positions 18 and 20 for marking e.g. by a laser, the bottom of each of the solar cells when the latter are retained in their respective indexing positions 18 and 20.

Referring to FIG. 8, the solar cells 22 and 22' are comprised of a base of p-type semiconductor material. This material comprises a p-layer 53 which is doped on one surface with an n-type material forming an n-layer 55 and forming an n-p junction 57 therebetween. The solar cells are typically about 8 mils thick, but can have a thickness of as little as 1–2 mils. The solar cells preferably are provided with a glass cover slide 59 which is doped with cerium or other material to protect the cells from radiation degradation in space.

Many of the solar cells thus produced are silicon cells. However, the tray of the invention is equally effective with other forms of solar cells, such as many III-V compounds. For example, gallium arsenide, gallium arsenide phosphide, and indium phosphide and II-IV cells, such as cadmium sulfide, and like cells can be used with the trays of the invention. Thus, the only a illustration of one form of cell which may be used in the invention.

Now referring to FIG. 6 of the drawings, with or without solar cells 22 and 22' retained in their indexing positions 18 and 20, a plurality of trays 12 can be stacked one on top of the other. For this purpose, it is noted that a pair of upstanding tabs 54 are provided on each of a pair of the opposite sides of the peripheral rim 16 of the tray. A pair of grooves 56 are provided on each opposite side of the tray bottom surface 58, the grooves 56 being in alignment with the tabs 54, and adapted to removably receive the tabs 54. Thus, it is noted that the trays can be stacked one above the other by inserting the tabs 54 on the top of each tray 12 into the grooves 56 in the bottom of another tray, and thereby essentially forming a tongue and groove registering means between adjacent trays. By forming the tabs 54 with a size so that they snuggly, but nevertheless removably fit within a corresponding groove of another tray, a type of locking action can be achieved to prevent inadvertent separation of the trays when stacked.

By further reference to FIG. 3, it can be noted that the integral upstanding indexing elements 24 and 28, and indexing elements 38 and 40, as well as any other indexing elements which may be formed in the tray, at the specified positions, are of a substantially equal height. Further, they are approximately equal to the height of the peripheral rim 16, so that when the trays are stacked, as shown in FIG. 6, the tops of such indexing elements are flush with the bottom surface 58 of the adjacent upper tray.

A notch 63 provided in the peripheral edge 16 near one corner of each tray adjacent the indexing position 18, permits easy alignment and registration of the trays to permit accurate and rapid stacking. The above identified construction permits efficient stacking of the trays, either with or without solar cells retained therein, manually or automatically for processing or storage.

According to another embodiment for stacking the trays, as shown in FIG. 7, the upstanding integral indexing elements e.g. indexing elements 38 and 40, as well as any other indexing elements which may be formed on the tray, can be designed to have a height greater than the height of the peripheral rim 16 of the trays, as shown at 60, so that the tops of such indexing elements protrude above the peripheral rim 16. A corresponding number of grooves or recesses 62 are provided in the bottoms 58 of the trays 12 to receive the upper ends of the indexing elements of a tray immediately thereneath. To facilitate entry and removal of an upstanding indexing pin in one tray from a recess in a tray immediately thereabove, it is desirable to form the pins and the recesses with an upward taper. The mating engagement of the indexing pin with the recesses 62 supplement the registration achieved by the mating engagement of the grooves 56 in the bottom of each tray and the tab 54 in the top of each tray, thus further facilitating stacking of the trays. With this arrangement, the trays 12 can be stacked in vertical relation, as in the case of the trays of FIG. 6, with the upwardly extending rim 16 of the trays essentially in contact with the bottom 58 of the adjacent tray.

Referring now to FIGS. 9 and 10, there is shown a mold 64 for producing the solar cell tray 12 of the invention. The mold 64 is comprised of a main mold section 66 and a cooperating mold portion 68. The mold 66 has a major flat surface 70 which forms the flat upper surface 26 of the tray 12. There is provided in the major flat surface 70 of the mold 66, a plurality of cylindrically shaped holes 72, each of such holes corresponding to a possible selected indexing position on the tray when the tray is molded. In this way, different combinations of indexing elements can be provided at such indexing positions to represent different pre-defined cell positions. In the preferred embodiment, the holes extend from one side of the mold to the other, as illustrated in FIG. 9. Plugs 74 are press-fitted into the mold and would otherwise be difficult to remove. By using holes extending from one side to the other, it is possible to push the plug out of the hole when the mold is to be re-used.

Cylindrically shaped plugs 74, as shown in FIG. 11, for example, are provided and which are capable of being inserted in any of the holes 72. Thus, in the present instance, as further illustrated in FIG. 10, cylindrically shaped plugs 74 are inserted into certain of the holes 72 with the outer surfaces 76 of the plugs 74 substantially coplaner with the mold major flat surface 70. With the plugs 74 substantially filling the holes 72, as shown in FIG. 9, no indexing position or element will be formed on the surface of the tray when molded. However, the presence of the plugs 74 at the major flat surface 70 of the mold 64 will form the mold parting lines 45 thereby representing an indexing position. On the other hand, if portions of the plugs 74 were removed, as for example, an upper end portion, before being inserted into the corresponding holes 72, a recess is formed and it will be seen that plastic could be introduced into such recess, and an integrally formed indexing element would be formed on the tray when molded.

In the present case, three mold plugs 74, of the type illustrated in FIG. 11, are placed in certain of the holes 72, as shown in FIGS. 9 and 10, to provide the indexing elements, such as indexing elements 24 and 38 of the tray shown in FIG. 2. It will be seen that the outer end 76 of the plug 74 has a section removed therefrom to form a semi-circular notch 80 therein with a vertical flat face 81 and a horizontal face 82 below the plane of the outer end 76. When the plugs 74 are inserted into the holes 72, as shown with the outer semi-circular surface 76 of the plug substantially coplaner with the mold major surface 70, the open notch 82 in the outer ends of the plugs 76 will permit introduction of liquid plastic into such semicircular notch and form the upstanding indexing elements 24 and 38 on the upper surface 26 of the tray base 14.

As indicated previously, one or more indexing elements, along with portions of the rim 16 will define an indexing position. In many cases, one edge of the pre-defined cell position may be formed by the arcuate edge of a indexing element and this would, of course, correspond to no plug in a hole in the mold. In other cases, it may be necessary to remove a portion of the indexing element by forming a notch therein with a flat face to define one edge of a pre-defined cell position, as for example, those cell positions 18 and 20. In the embodiment as shown, the upstanding indexing elements 38 and 40 are formed in the mold when using plugs having an outer section removed, similar to the plug 74, but with different sized notches formed therein.

It is also possible to use a mold where the holes do not extend from one side of the mold to the other. In this way a presence of a plug in the mold would define an indexing position, but would not permit formation of an indexing element. A lack of a plug in the hole or a plug in the hole with an upper portion removed would then cause formation of an indexing element in the molded tray.

The mold 66 also has therein inserts or members to provide the vacuum channels 46 or chamber 47, and a recess 84 to provide peripheral rim 16. The mold is provided with means or a surface contour to form the peripheral tabs 54, and mating grooves 56, and the vacuum port 48, the laser marking hole 52 and the probe holes 50 to be formed in the tray.

To mold the tray 12 of the invention, employing the molding apparatus 64 shown in FIGS. 9 to 11, a castable or moldable resin is introduced into the cavity between the mold 66 and the co-operating mold 68. Generally, and in a preferred embodiment, the trays are formed in a molding operation, such as injection molding or compression molding. However, other methods of forming the trays may be employed, as for example, by stamping. Some of the suitable resins which may be employed are polyethylene, polyvinyl chloride, some of the common acrylics, acrylonitrile-butadiene-styrene, some polyesters, etc. The selected material is introduced between the main mold section 66 and the cooperating mold portion 68, and the resin is permitted to cure under conventional curing conditions to provide a molded plastic tray as illustrated in FIGS. 1 to 5. However, as indicated, any material which is readily formable may be used and the invention is not limited to the use of plastics. When the two molds are closed the lower surface of the mold portion 68 will shift downwardly to the line designated by reference numeral 86 and this will represent the lower surface of the base 14.

Now referring to FIG. 12, there is shown an apparatus 87 for automatically testing a plurality of solar cells positioned on a plurality of stacked trays of the type illustrated in FIGS. 1 to 5. Thus, the solar cells 22 and 22', and preferably only one of the cells 22 or 22', are placed in their pre-defined cell positions 18 or 20 respectively, on the tray 12, using either an automatic handler for loading the trays or manual loading. The trays containing the solar cells as indicated in FIG. 2 are stacked in vertical relation as indicated in FIG. 6 or 7. The stack of trays, indicated at 85, is initially positioned at a fixed loading station 88 of the apparatus 87, which comprises a fixed outer ring portion 90 and a rotatable inner portion or turntable 92. The lowermost tray 12 of the stack of trays 85 at the loading station 88, is automatically pushed onto the turnable 92, and the turnable 92 is rotated clockwise sufficiently to place the tray 12 opposite the testing station 94. At the testing station 94, the tray 12 remains in its position on the turntable and the probes, such as electrical test probes, at test station 94 extend outwardly to engage the cell on the tray. As an alternative, if desired the tray could be automatically pushed outwardly onto the fixed portion 90 of the device and tested at station 94. During the testing operation test probes, (not shown) are inserted into the probe holes 50 of the tray to contact the solar cells at the bottom thereof, with additional upper electrical probes 96 contacting the top of the solar cells. A vacuum probe (not shown) also communicates with the vacuum port 48 prior to contact of the electrical probes with the cell, so that electrical testing is carried out while the cell is retained in position by the vacuum. The signal obtained during electrical testing is used to determine the electrical characteristics of the solar cell so as to permit the trays carrying the solar cell to be sorted for use depending on such electrical characteristics obtained during testing.

A number of sorting bins for the trays containing the solar cells which have been tested are positioned in spaced locations around the fixed outer portion 90 of the apparatus 87, there being ten of such bins, numbered 1 to 10 around the apparatus, as indicated. When testing of the solar cells on one tray 12 has been completed at the test station 94, and the electrical and vacuum probes have been removed, the tested tray is then removed back onto the turntable 92, and the turntable 92 continues to rotate clockwise, as shown in FIG. 12. Rotation occurs intermittently to move the cells between the various work stations, e.g. to move the trays to the proper position for the initial loading of a tray on the turntable at load station 88 and for testing of the solar cells on the individual trays adjacent test station 94. The trays containing the tested cells indicated at 100 are rotated periodically until positioned opposite one of the bins 1 to 10 for the storage of cells having a predetermined set of electrical characteristics corresponding to the particular cells on that tray. When properly positioned, the tray containing the tested solar cells is stacked into that particular sorting bin, for subsequent usage.

A computer or microprocessor 102 is connected to and controls the apparatus to perform the various functions set forth. At the load station and at the storage bins, conventional ejection fingers, for example, could be employed to engage and move the trays. Tray transfer plates or the like could also be employed. A conventional fluid operated drive system could also be employed for this purpose.

It will be seen that various changes and modifications can be made in the invention as described above. Thus, it will be apparent that while the arrangement of indexing positions and elements shown in the tray of FIGS. 1 to 5 provide for two different solar cell sizes on the same tray, it is possible to design the try with more than two indexing positions adapted for varying size solar cells to be provided on the same carrier or tray. Also, the arrangement and shape of the indexing elements at the respective indexing positions can be varied. Further, although the mold apparatus illustrated in FIGS. 9 to 11 of the drawings is particularly advantageous for producing the tray of the invention, other types of molding apparatus using the molding features of the invention can be employed. For example, it is possible to use a system wherein the individual molds are machined, as required; although the molding arrangement of the invention is preferred to obtain the cost and time advantages. Further, the tray containing the preselected indexing positions and the indexing elements can be formed by processes other than molding. In addition, the tray can be comprised of materials other than plastics, such as ceramics, and the like.

Thus, there has been described a unique and novel carrier system or tray for transporting, testing and storing of photovoltaic or solar cells, preferably comprised of a molded plastic having preselected indexing positions for retaining solar cells of varying sizes and/or shapes, which are arranged for efficient and rapid testing of such cells. The invention also includes as a novel feature the mold apparatus for producing such trays, and the novel process for molding such trays employing such mold apparatus. The invention provides numerous advantages over prior art systems for testing solar cells, including substantially reduced handling of solar cells with substantially reduced damage and breakage of solar cells, thereby substantially reducing the cost of such solar cells. Accurate positioning of the solar cells on the trays enables rapid and efficient testing and the trays of the invention permit simultaneous handling and testing of solar cells of different sizes, as desired. Since a minimum of handling is required, this avoids the necessity for the use of special handling gloves by operators in many steps, together with reduced risk of contamination of the solar cells. The invention also affords rapid and efficient automatic testing of solar cells employing the novel trays hereof.

It should be understood that many other changes, modifications, variations and other uses and applications will become apparent to those skilled in the art after considering this specification and the accompanying drawings. Therefore, any and all such changes, modifications, variations and other uses and applications which may be become apparent to those skilled in the art, after considering this specification, are deemed to be covered by the invention which is limited only by the appended claims.

I claim:

1. A tray for retaining a flat photovoltaic cell in a pre-defined cell position, said tray comprising:
    (a) a base having an upper surface thereon against which the flat cell can lie;
    (b) at least three upstanding indexing elements integrally formed with said base upper surface at said cell position, said indexing elements being integrally formed with said base upper surface at said pre-defined cell position to thereby define the pre-defined cell position for the flat photovoltaic cells,
    (c) walls defining a recess in said upper surface of said base, said recess lying between said indexing elements so that when a cell lies on said upper surface the cell covers said recess, a vacuum connection to said recess so that when vacuum is drawn on said recess a cell lying thereover is retained against said upper surface; and
    (d) walls defining at least one probe opening through said base, said probe opening being positioned between said indexing elements and away from said vacuum recess so that a photovoltaic cell can be vacuum restrained against said bottom surface and probed both top and bottom.

2. The tray of claim 1 wherein at least one of said upstanding indexing elements is a portion of a rim located along the periphery of said tray.

3. The tray of claim 1 wherein there is a peripheral edge around said base and said peripheral edge comprises one of said indexing elements and said peripheral edge is sufficiently high to permit stacking without contact with a cell positioned between said indexing elements.

4. The tray of claim 1 wherein at least two of said upstanding indexing elements comprise an upstanding rim which extends peripherally around the base, and a plurality of permanently located tray registering members are located along the periphery of said rim.

5. The tray of claim 1 wherein there is a plurality of apertures extending through said base and said probe apertures are located so that probes can extend through said apertures and contact the underside of a cell positioned by said indexing elements.

6. The tray of claim 1 wherein each of said indexing elements has substantially the same height and each is positioned to contact the Edge portion of said cell in a pre-defined cell position.

7. The tray of claim 6 wherein at least one indexing element comprises an upstanding peripheral rim around the base upper surface and is of at least the same height as said plurality of indexing elements, said peripheral rim being adapted to contact another edge portion of a cell in said pre-defined cell position.

8. The tray of claim 7, including upstanding tab portions on said peripheral rim and cooperating grooves in the undersurface of said base, to permit a plurality of trays to be arranged in vertically stacked relation, with said tab portions in mating engagement with said grooves of adjacent trays.

9. A stackable tray for transport and storage of a photovoltaic cell and which enables processing or testing to be conducted on the cell while in said tray, said tray being formed of synthetic polymer composition material and comprising:
 (a) a substantially flat base having an upper surface thereon;
 (b) a peripheral rim on said base extending above said base greater than the thickness of the cell, so that a plurality of said trays can be stacked without contacting the top of a cell, said rim at least partially retaining the cell within a pre-defined position on said upper surface;
 (c) indexing means integrally formed on said upper surface for engaging an edge portion of the cell and retain the cell within said pre-defined position;
 (d) walls defining a chamber beneath a portion of the cell located in the pre-defined position;
 (e) a vacuum port communicating with said chamber for creation of a vacuum within said chamber to retentively hold the cell in the pre-defined position; and
 (f) an aperture in said base extending through said base and to said upper surface to permit a probe to extend through said aperture and contact said cell while the cell is being vacuum retained against said upper surface.

10. The tray of claim 9 wherein said aperture comprises a plurality of apertures spaced along a portion of the base and located so that a plurality of probes can extend through said apertures to contact a cell in the pre-defined position.

11. The tray of claim 9 wherein said indexing means is for providing a plurality of possible indexing positions and where an integrally formed indexing element is formed at selected indexing positions to provide a plurality of pre-defined cell positions.

12. The tray of claim 9 wherein said peripherally extending rim being disposed around the entire base, said indexing means on said upper surface comprising a plurality of upstanding indexing elements integrally connected to said base, said upstanding indexing elements and said peripheral edge contacting the sides of the photovoltaic cell to retain the cell in said pre-defined cell position.

13. The tray of claim 9 wherein walls forming said chamber comprising a plurality of channels in said base in the defined position beneath the solar cell, said vacuum port comprising a hole in said base in communication with said channels.

14. The tray of claim 9 including co-operating tab means and groove means on said peripheral rim and on the undersurface of said base, to permit a plurality of trays to be arranged in vertically stacked relation, with the tab means in mating engagement with the groove means of adjacent trays.

15. A tray assembly comprised of a plurality of stacked individual unitary trays each molded of synthetic polymer composition material, with each adapted for storage and transport of a photovoltaic cell, each said tray comprising:
 (a) a base having an extended substantially flat upper surface adapted to receive and support a photovoltaic cell thereon and a lower surface;
 (b) an upstanding peripheral rim on said base surrounding the periphery of said base, said rim extending above said upper surface a greater distance than the thickness of the cell;
 (c) an outwardly struck tab on one of the upper surface of the rim or the lower surface of said base, and means for forming a groove on the other of the upper surface of said rim or said lower surface of said base, said tab on one tray being located and sized to extend into said groove on another tray immediately thereabove or immediately thereunderneath when said trays are stacked in a nested arrangement;
 (d) a plurality of indexing elements integrally formed with said base upper surface on each tray within said rim and together defining a pre-defined cell location for retaining a photovoltaic cell so that a cell can rest on said base between said indexing elements without contacting the bottom of the base of the tray next above, said indexing elements extending upwardly from said base upper surface to approximately at least the same height above said surface as the upper portion of said rim so as to support the tray next above within said rim, and said plurality of indexing elements and rim each being adapted to engage the bottom wall of a tray stacked immediately thereabove so that a stacked plurality of like trays are in a nested arrangement with a photovoltaic cell in each tray restrained by the indexing elements of that tray against horizontal shifting and separated from the bottom surface of that tray stacked immediately thereabove; and
 a recess in the upper surface of each tray below the cell therein so that the cell can be retained by vacuum when the top surface of the cell is exposed for testing.

16. The tray assembly of claim 15 wheren said indexing elements in combination are capable of defining a plurality of pre-defined cell locations.

17. The tray assembly of claim 16 wherein recess forms a vacuum chamber below at least one of said cell locations in each such tray.

18. The tray assembly of claim 15 wherein said tab is located on the rim of each tray and the groove is formed on the lower surface of each tray.

19. The tray assembly of claim 18 wherein said indexing elements on said base have substantially the same height as said rim on each said tray.

20. The tray assembly of claim 18 wherein said indexing elements on said base have a height substantially equal to that of the tab on the rim and are adapted to extend into recesses on the undersurface of tray located immediately thereabove.

\* \* \* \* \*